US005358897A

United States Patent [19]

Valster et al.

[11] Patent Number: 5,358,897
[45] Date of Patent: Oct. 25, 1994

[54] METHOD OF MANUFACTURING RADIATION-EMITTING SEMICONDUCTOR DEVICES

[75] Inventors: Adriaan Valster; Coen T. H. F. Liedenbaum, both of Eindhoven, Netherlands

[73] Assignee: U.S. Philips Corporation, New York, N.Y.

[21] Appl. No.: 169,846

[22] Filed: Dec. 17, 1993

Related U.S. Application Data

[60] Division of Ser. No. 94,585, Jul. 20, 1993, Pat. No. 5,296,717, which is a continuation of Ser. No. 691,205, Apr. 25, 1991.

[30] Foreign Application Priority Data

May 23, 1990 [NL] Netherlands .......................... 9001192
May 23, 1990 [NL] Netherlands .......................... 9001193

[51] Int. Cl.$^5$ ............................................. H01L 21/20
[52] U.S. Cl. ........................................ 437/129; 257/13; 257/94; 372/43
[58] Field of Search .................. 437/129; 372/43-50; 257/13, 94, 95

[56] References Cited

U.S. PATENT DOCUMENTS

| | | | |
|---|---|---|---|
| 4,585,491 | 4/1986 | Burnham et al. | 372/45 |
| 5,003,549 | 3/1991 | Mitsui et al. | 372/46 |
| 5,036,521 | 7/1991 | Hatakoshi et al. | 372/46 |
| 5,060,236 | 10/1991 | Yagi et al. | 372/50 |

Primary Examiner—R. Bruce Breneman
Assistant Examiner—Ramamohan Rao Paladugu
Attorney, Agent, or Firm—Paul R. Miller

[57] ABSTRACT

Radiation-emitting semiconductor diodes in the form of diode lasers or LEDs are used inter alia in information processing systems. There is a particular demand for diodes having a low wavelength. A diode laser which emits at 633 nm is a particularly attractive alternative to a helium-neon gas laser. According to the invention, a method of making a the buffer layer of such a radiation-emitting semiconductor diode comprises aluminium-gallium arsenide, the aluminium content having at least a minimum value belonging to the band gap of the active layer. The minimum Al content is approximately 6 at % for an InGaP band gap of 1.88 eV, and approximately 9 at % for 1.92 eV. As a result, an active layer comprising InGaP emits, for example, at 650 nm while the semiconductor layers still possess a good crystal quality and morphology. When the active layer of a diode laser has a multiple quantum well structure with comparatively thick (approximately 5 nm) well layers, it even emits at 633 nm. In this method according to the invention, a comparatively high growing temperature—preferably approximately 760° C.—and a buffer layer comprising AlGaAs with a suitable aluminium content are used. Ordering of the structure in semiconductor layers comprising InGaP and InAlGaP is counteracted by this.

6 Claims, 3 Drawing Sheets

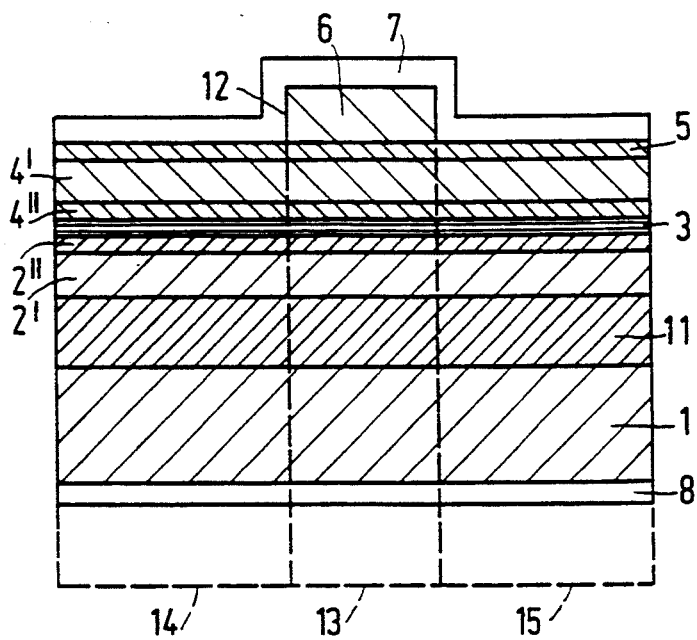
FIG.1A
FIG.1B
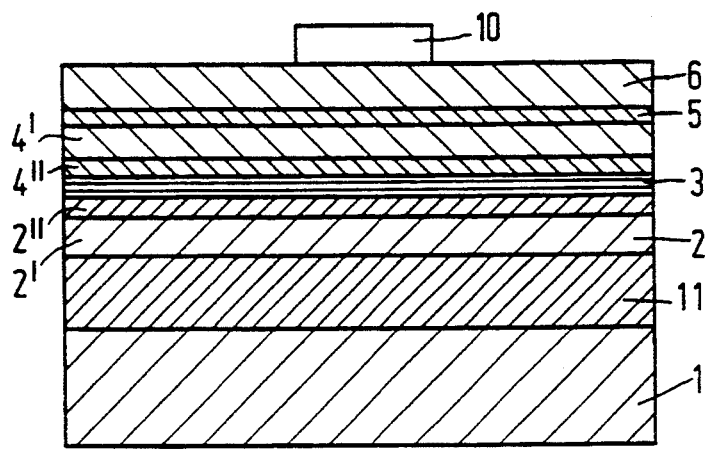
FIG.2

METHOD OF MANUFACTURING RADIATION-EMITTING SEMICONDUCTOR DEVICES

This is a division of application Ser. No. 08/094,585, filed Jul. 20, 1993 now U.S. Pat. No. 5,296,717, which is a continuation of application Ser. No. 07/691,205, filed Apr. 25, 1991.

The invention relates to a radiation-emitting semiconductor diode comprising a semiconductor body with a semiconductor substrate of a first conductivity type on which are at least present in order a first cladding layer of the first conductivity type, an active layer, and a second cladding layer of a second conductivity type, the cladding layers comprising indium-aluminium-gallium phosphide (InAlGaP) and the active layer comprising indium-gallium phosphide (InGaP) or indium-aluminium-gallium phosphide (InAlGaP) as the semiconductor material, which semiconductor materials each comprise a mixed crystal having two sublattices in which the phosphorus atoms are present on the one sublattice and the atoms of the other elements on the other sublattice, and in which a buffer layer of the first conductivity type is disposed between the substrate and the first cladding layer. The invention also relates to a method of manufacturing a radiation-emitting semiconductor diode whereby at least a first cladding layer of indium- aluminium-gallium phosphide and of a first conductivity type, an active layer of indium-gallium phosphide, and a second cladding layer of indium-aluminium-gallium phosphide and of a second conductivity type are provided in that order on a semiconductor substrate of gallium arsenide and of the first conductivity type, a buffer layer being provided before the application of the first cladding layer.

BACKGROUND OF THE INVENTION

Such radiation-emitting semiconductor diodes, especially if the wavelength of the emission is in the visible part of the spectrum, are suitable radiation sources—if designed as diode lasers—for inter alia information-processing systems such as laser printers with which information is written, optical disc systems such as Compact Disc (Video) (CD(V)) players or bar code readers, by which information is read, and Digital Optical Recording (DOR) systems, by which information is written and read. There are also numerous applications in optoelectronic systems for LED versions of such diodes.

Such a radiation-emitting diode and such a method for manufacturing same are known from the article "AlGaInPP Double Heterostructure Visible-Light Laser Diodes with AlGaInPP Active Layer Grown by Metalorganic Vapor Phase Epitaxy" by K. Kobayashi et al., published in IEEE Journal of Quantum Electronics, vol. QE-23, no. 6, June 1987, p. 704. In this article, a radiation-emitting semiconductor diode is described on which an active layer of InGaP is present on a substrate of n-GaAs between two cladding layers of InAlGaP. The semiconductor materials of these layers each comprise a mixed crystal having two sublattices in which the phosphorus atoms are present on the one sublattice and the atoms of the other elements, in this case In and Ga atoms for the active layer and In, Al, and Ga atoms for the cladding layers, are present on the other sublattice. A buffer layer of GaAs is present between the substrate and the first cladding layer. The wavelength of the emission of the diode, which is constructed as a laser here, is approximately 670 nm (i.e. the wavelength in photoluminescence is approximately 660 nm, which corresponds to a band gap of approximately 1.88 eV).

A disadvantage of the known radiation-emitting semiconductor diode is that the experimentally found wavelength for the emission is higher than the theoretically expected one: for example, the wavelength expected for an InGaP active layer is approximately 650 nm, whereas approximately 670 nm or more is often found in practice. A similar effect occurs in the case of cladding layers comprising InGaAlP, where the experimentally found band gap again is less than the theoretically expected one. The band gap of both the active layer and the cladding layer may be increased by increasing the aluminium content of these layers. This possibility is limited, especially for the cladding layers which contain indirect semiconductor materials, because progressive addition of aluminium results in an ever smaller increase in the band gap, and doping of the cladding layers becomes more difficult. As regards the active layer, another possibility is to make the latter thinner, which, however, renders manufacture more difficult. It was found experimentally that the use of misoriented substrates, for example (311) or (511) substrates, causes the experimental band gap—and thus the wavelength of the emission—to lie (much) closer to the theoretically expected value. The use of misoriented substrates, however, is more expensive and has the drawback that it restricts the choice of the longitudinal direction of the resonance cavity.

The present invention has for its object inter alia to provide a radiation-emitting semiconductor diode—especially a semiconductor diode laser—which does not have the previous disadvantage, or at least to a much lesser extent, and therefore combines a lowest possible emission wavelength with a highest possible band gap of the cladding layers. The present invention has for its further object to realise a diode having an active layer which comprises InGaP with a band gap which is equal to approximately 1.94 eV, which corresponds to a wavelength of approximately 650 nm for a diode laser (the wavelength in photoluminescence is then approximately 640 nm). In particular, the invention has for its object to realise such a diode which emits at a wavelength of 633 nm, which is exactly the wavelength of a helium-neon gas laser. The invention also has for its object to provide a simple method of manufacturing such a radiation-emitting semiconductor diode.

According to the invention, a radiation-emitting semiconductor diode of the kind described in the opening paragraph is for this purpose characterized in that the buffer layer comprises aluminium-gallium arsenide (AlGaAs), of which the aluminium content has at least a minimum value belonging to the band gap of the active layer. Failure of the band gap to attain the theoretically expected value is found to be caused by an ordering occurring in the crystal (sub)lattice of the III-elements in the mixed crystals of the cladding layers and the active layer. It appears to be possible for such an ordering to occur in mixed crystals of various materials, the ordering taking place for the materials used here in the 178 (111)A planes and resembling the ordering of the so-called CuPt structure. Besides the substrate orientation, growing conditions such as the growing temperature were found to have an influence on whether or not this ordering takes place. Especially at a comparatively high growing temperature, little or no ordering takes place so that the band gap of the layer provided a maximum. In comparison, when the known buffer layer is used, however, the crystal structure of InGaP or InAlGap semiconductor layers manufactured at higher temperatures is poor, which is very detrimental to the quality of the radiation-emitting semiconductor diode. A buffer layer comprising AlGaAs with an aluminium content higher than or equal to a minimum value belonging to the band gap of the active layer is suprisingly found to render it possible to apply the InGaP or InAlGaP layers at higher than the usual temperatures—and consequently with a more disorderly distribution of the atoms of the remaining elements over the other sublattice—while nevertheless semiconductor layers having a very good morphology and crystal structure are obtained. The semiconductor layers obtained as a result have a band gap which corresponds to a more random distribution of the atoms of the remaining elements over the other sublattice. This means for the semiconductor materials used here that, for example, $In_{0.49}Ga_{0.51}P$ has a band gap of approximately 1.85 eV (with a highly ordered structure) and a band gap of approximately 1.94 at a substantially completely disordered distribution, which corresponds to an emission wavelength of approximately 680–650 nm. In the case of $In_{0.5}Al_{1.10}Ga_{0.15}P$, for example, the band gap (in the case of substantially complete disorder) is approximately 2.05 eV and for $In_{0.5}Al_{0.30}Ga_{0.20}P$ this is 2.3 eV, which are higher values than those found for the same materials in an orderly structure. For an InGaP active layer having a band gap of approximately 1.88 eV, for example, the minimum aluminium content of the buffer layer is approximately 6 atom percent. For an InGaP active layer having a band gap of approximately 1.92 eV, the minimum aluminium content of the buffer layer is approximately 9 atom percent. No upper limit for the aluminium content of the AlGaAs buffer layer was found. Preferably, however, the aluminium content is chosen to be smaller than 100 atom percent since pure AlAs is rather hygroscopic, which may lead to problems when the cleavage surfaces to be formed are exposed to the air. To safeguard a good electric conduction, the aluminium content may be further reduced to those contents at which a relatively low resistivity is still possible. No lower limit was found for the thickness of the buffer layer: buffer layers having a thickness of 6 Å and an aluminium content of 20% were also very satisfactory. Good results were obtained with a buffer layer thickness between 0.1 and 1 μm. It should be noted that there is an AlGaAs layer between a DH (Double Hetero) structure and the substrate in the device described in the article "Fabrication and optical characterization of first order DFB InGaP/AlGaInP laser structures at 639 nm" published in Electronics Letters, 26th Apr. 1990, vol. 26, no. 9, p. 614. This does not relate to a radiation-emitting diode, however, since no pn junction is present, neither is an aluminium content specified or suggested. In addition, it is apparent from the specified wavelength of the emission of the InGaP, namely a photoluminescence wavelength of 670 nm (i.e. the band gap corresponds to 1.85 eV) that the InGaP has a very strongly ordered distribution of the atoms of the remaining elements over the other sublattice (the wavelength of the emission will be approximately 680 nm in a version designed as a diode laser). In the radiation-emitting semiconductor diode according to the invention, the substrate used may be a (substantially perfectly oriented) (001) substrate, which is an important advantage, as explained above. Preferably, a substrate of gallium arsenide is used, but other substrates, for example a silicon substrate, may alternatively be used. In a favourable embodiment, the substrate comprises gallium arsenide which is provided with a conducting layer at the lower side, an intermediate layer of indium-gallium phosphide or aluminium-gallium arsenide and a contact layer of gallium arsenide, which layers are of the second conductivity type, are present in that order on the upper cladding layer, and the semiconductor body comprises a mesa-shaped strip adjoining its surface, which strip comprises at least the contact layer and is coated with another conducting layer which extends to outside the mesa-shaped strip and beyond. This strip forms a junction constituting a barrier with a layer situated below it. In this embodiment, the current is very effectively limited to the active region situated below the mesa-shaped strip, which promotes a low starting current. This embodiment has the additional advantage that the radiation-emitting semiconductor diode is of a simple structure and very easy to manufacture: the other conducting layer can be provided without a masking step. To realise a wavelength which is as low as possible, an active layer is preferably used which comprises a multiple quantum well structure with well layers of InGaP and barrier layers of InAlGaP. No very thin layers are required in a radiation-emitting semiconductor diode according to the invention for obtaining a substantial increase of the wavelength: quantum well and barrier layers having a thickness between approximately 4 and 6 nm are already sufficiently thin and are comparatively easy to manufacture. Thus radiation-emitting semiconductor diodes according to the invention were manufactured having an emission wavelength of 633 nm, which is equal to the wavelength of an He-Ne gas laser, where the active layer was formed with eight InGaP quantum well layers having a thickness of approximately 5 nm separated by barrier layers having a thickness of approximately 4 nm. The cladding layers formed a so-called SCH (Separate Confinement Hetero) structure with aluminium contents of 25 at % for the separate confinement layers and 35 at % for the cladding layers.

A method of manufacturing a radiation-emitting semiconductor diode according to the invention is characterized in that the semiconductor material chosen for the buffer layer is aluminium-gallium arsenide with an aluminium content which is at least equal to a minimum value belonging to the band gap of the active layer, while a growing temperature is chosen higher than 700° C. In this way the disorder in the distribution of the atoms of the elements other than phosphorus over the sublattice in which these elements are present is promoted, so that diodes having the desired characteristics are obtained. Owing to the comparatively high temperature, semiconductor layer structures with excellent characteristics, such as a good morphology, a good crystal structure, and good interfaces, are obtained. Preferably, a growing temperature of at least 730° C. is chosen, while the best results are obtained with a temperature of approximately 760° C. with the use of MOVBE as the growing technique. A minimum aluminium content value for the buffer layer of approximately 6 at % belongs to a growing temperature of approximately 730° C. At 760° C. the minimum aluminium content is approximately 9 at %. In this process, the substrate chosen is preferably a (001) substrate, and the ratio of the quantity of III and V elements offered during the application of the semiconductor layers is chosen to lie between approximately 100 and 400. These V/III ratios were found to be favourable for obtaining the greatest possible disorder in the mixed crystals of the semiconductor layers formed.

BRIEF DESCRIPTION OF THE DRAWING FIGURES

The invention will now be explained in more detail with reference to two embodiments and the accompanying drawing, in which FIG. 1 shows in cross-section an embodiment of a radiation-emitting semiconductor diode according to the invention; and FIG. 1a shows in cross-section multiple active layers in FIG. 1;

FIGS. 2 and 3 show in cross-section the radiation-emitting semiconductor diode of FIG. 1 in consecutive stages of manufacture;

Figure 3:
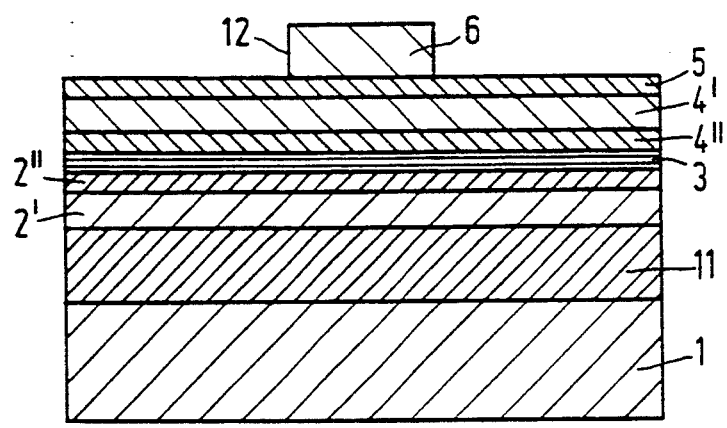

The Figures are diagrammatic and not drawn to scale, the dimensions in the thickness direction being particularly exaggerated for greater clarity. Corresponding parts in the various examples are generally indicated with the same reference numerals. Semiconductor regions of the same conductivity type are hatched in the same direction as a rule.

DESCRIPTION OF THE INVENTION

FIG. 1 shows in cross-section a first embodiment of a radiation-emitting semiconductor diode according to the invention. The semiconductor diode comprises a semiconductor body having a substrate region 1 provided with a connection conductor 8, which substrate region is of a first conductivity type, in this case the n-conductivity type and in this example consists of monocrystalline gallium arsenide. On this substrate is provided a semiconductor layer structure which comprises inter alia a first cladding layer 2 of n-InAlGaP, an active layer 3 of InGaP, and a second cladding layer 4 of p-InAlGaP. The phosphorus atoms in these mixed crystals are present on one sublattice, while the atoms of the remaining elements are present on another sublattice. According to the invention, a buffer layer 11 of aluminium-gallium arsenide (AlGaAs) is present between the substrate region 1 and the first cladding layer 2, the aluminium content having at least a minimum value corresponding to the band gap of the InGaP active layer 3. In this example the band gap of a (thick) InGaP layer is approximately 1.92 eV, and the minimum aluminium content of the buffer layer is approximately 9 at %. An aluminium content of the buffer layer of approximately 20 at % is used in this example. As a result, the layers present above the buffer layer 11 can be given characteristics which are required for a satisfactorily operating diode, while they are provided at a comparatively high growing temperature: thus these layers can possess inter alia an excellent morphology, good crystalline characteristics, evident from inter alia a small line width in a double-crystal measurement, and excellent optical characteristics such as an intense and narrow luminescence peak. Thanks to the comparatively high temperature during the provision of the semiconductor layers above the buffer layer 11, the distribution of the III-elements over the other sublattice has a character which is as disorderly as possible, so that the band gap of the active layer (distribution of In and Ga atoms) of the InGaP is comparatively great, for example 1.92 eV, so that the wavelength is comparatively low. The same holds for the cladding layers 2,4 of InAlGaP, which at an aluminium content of 35 at %, for example, have a band gap of approximately 2.3 eV, so that the resulting diode has a starting current with a small temperature dependence. In the present example, the cladding layers 2 and 4 comprise 0.8 μm thick sublayers 2' and 4', which contain $In_{0.5}Al_{0.35}Ga_{0.15}P$, and 25 nm thick sublayers 2" and 4" (the so-called Separate Confinement layers), which contain $In_{0.5}Al_{0.25}Ga_{0.25}P$, while the active layer 3 comprises a multiple quantum well structure which has eight 5 nm thick well layers of 3' InGaP, mutually separated by seven 4 nm thick layers 3" of $In_{0.5}Al_{0.25}Ga_{0.25}P$ as shown in FIG. 1a. As a result, and in spite of the comparatively great thickness of the quantum well layers, the radiation-emitting semiconductor diode according to the invention has a particularly low emission wavelength in the present example, of, 633 nm and forms an attractive alternative to helium-neon gas lasers which emit at the same wavelength. Helium-neon gas lasers are much more expensive and robust, and also consume more energy than diode lasers. The fact that the quantum well layers are allowed to be comparatively thick is a result of the disorderly distribution mentioned above and the accompanying comparatively great band gap. The buffer layer comprising AlGaAs contains 20 at % aluminium in the present example. The thickness of the buffer layer was 0.1 μm in this example. Above the second cladding layer 4, there are present an intermediate layer 5 of the opposite, in this case the p-conductivity type and made of indium-gallium phosphide here, and a contact layer 6 also of the opposite, in this case the p-conductivity type and made of gallium arsenide here, forming a mesa-shaped strip 12. A conducting layer 7 is provided over this mesa-shaped strip, which layer forms a junction, which constitutes a barrier, with the intermediate layer 5 situated below it outside the mesa-shaped strip 12. As a result, no or substantially no current flows through the regions 14 and 15 in the semiconductor body next to the mesa-shaped strip 12 below a certain voltage when the conducting layers 7 and 8 are included in a current circuit. Within the semiconductor body, there is a strip-shaped region 13 of which the mesa-shaped strip 12 forms part, within which region there is a pn junction which causes the emission of electromagnetic radiation in the case of a sufficiently high current in the forward bias direction. Since the conducting layer 7 has a good electrical contact with the contact layer 6, the region 13 forms a preferential path for the electric current. In this example the radiation-emitting semiconductor diode is constructed as a diode laser, more particularly of the gain-guided type. This means that the emission is coherent at a sufficiently high current strength. In view of the diode laser construction, the mesa-shaped strip 12 is bounded perpendicularly to the longitudinal direction by two parallel mirror surfaces lying in the plane of the drawing, which surfaces coincide with natural cleavage surfaces of the crystal from which the semiconductor body is formed. This leads to the formation inside the strip-shaped region 13 in the active layer 3 of a resonance cavity for the radiation generated. The diode laser of this example can be easily manufactured and possesses a very low emission wavelength but also a small temperature dependence of the starting current, and therefore a high maximum operating temperature. The following compositions, doping levels and thicknesses were used for the various semiconductor layers in the present embodiment.

TABLE

| Layer | Semiconductor | Type | Doping concentr. (at/cm$^3$) | Thickness ($\mu$m) | Band gap |
|---|---|---|---|---|---|
| 1 | GaAs (substrate) | N | $2 \times 10^{18}$ | 350 | 1.4 |
| 11 | Al$_{0.2}$Ga$_{0.8}$As | N | $2 \times 10^{18}$ | 0.1 | 1.7 |
| 2' | In$_{0.5}$Al$_{0.35}$Ga$_{0.15}$P | N | $2 \times 10^{18}$ | 0.8 | 2.3 |
| 2" | In$_{0.5}$Al$_{0.25}$Ga$_{0.25}$P | N | $2 \times 10^{18}$ | 0.025 | 2.15 |
| 3 | In$_{0.5}$Ga$_{0.5}$P (8x): 5 nm + In$_{0.5}$Al$_{0.25}$Ga$_{0.25}$P (7x) 4 nm | | | | |
| 4" | In$_{0.5}$Al$_{0.25}$Ga$_{0.25}$P | P | $4 \times 10^{17}$ | 0.025 | 2.15 |
| 4' | In$_{0.5}$Al$_{0.35}$Ga$_{0.15}$P | P | $4 \times 10^{17}$ | 0.8 | 2.3 |
| 5 | In$_{0.5}$Ga$_{0.5}$P | P | $1 \times 10^{18}$ | 0.1 | 1.9 |
| 6 | GaAs | P | $2 \times 10^{18}$ | 0.5 | 1.4 |

The width of the mesa-shaped strip 12 is approximately 7 $\mu$m. The conducting layer 8 on the substrate 1 in the present embodiment is a gold-germanium-nickel layer having a thickness of approximately 1000 Å. The conducting layer 7 in this example is a platinum, a tantalum, and a gold layer with thicknesses of approximately 1000, approximately 500, and approximately 2500 Å, respectively.

The radiation-emitting semiconductor diode described is manufactured as follows according to the invention (see FIGS. 2 and 3). The starting point is a (001) substrate 1 of monocrystalline n-type gallium arsenide with a doping concentration of $2 \times 10^{18}$ atoms per cm$^3$ and a thickness of, for example, 350 $\mu$m. After polishing and etching of the surface having the (001) orientation, the following is grown on this surface, for example, from the gas phase by means of OMVPE (Organo Metallic Vapour Phase Epitaxy) in that order: a 0.5 $\mu$m thick layer 11 of the n-conductivity type, for which according to the invention aluminium-gallium arsenide with an aluminium content having at least a minimum value belonging to the band gap of the active layer and a growing temperature of at least approximately 700° C. are chosen. An aluminium content of the buffer layer which is at least approximately 9 at % must be chosen for the growing temperature of approximately 760° C. chosen here. In the present example, an aluminium content of approximately 20 at % is chosen. The subsequent semiconductor layers are provided at the same comparatively high temperature of approximately 760° C. Among the advantages of this is that the temperature need not be switched, which simplifies the method and improves the quality of the interfaces between two adjoining semiconductor layers. The latter has the advantage that the III-elements of the subsequent layers are distributed as disorderly as possible over the relevant sublattice, so that the band gap of these layers is at its maximum. The doping concentration of the buffer layer 11 is chosen to be approximately $2 \times 10^{18}$ atoms per cm$^3$ in this example. In the case of a V/III ratio lying between 100 and 400, the following are provided in that order: a 0.8 $\mu$m thick layer 2' of n-type In$_{0.5}$Al$_{0.35}$Ga$_{0.15}$P having a doping concentration of $2 \times 10^{18}$at/cm$^3$, a 25 nm thick layer 2" of n-type In$_{0.5}$Al$_{0.25}$Ga$_{0.25}$P having a doping concentration of approximately $2 \times 10^{18}$ atoms per cm$^3$, an active layer 3 comprising eight 5 nm thick layers of In$_{0.49}$Ga$_{0.51}$P alternating with seven 4 nm thick layers of In$_{0.5}$Al$_{0.25}$Ga$_{0.25}$P, a 25 nm thick layer 4" of p-type In$_{0.5}$Al$_{0.25}$Ga$_{0.25}$P having a doping concentration of approximately $4 \times 10^{17}$ atoms per cm$^3$, a 0.8 $\mu$m thick layer 4' of p-type In$_{0.5}$Al$_{0.35}$Ga$_{0.15}$P having a doping concentration of approximately $4 \times 10^{17}$ atoms per cm$^3$, a 0.08 $\mu$m thick layer 5 of p-type In$_{0.49}$Ga$_{0.51}$P having a doping concentration of $1 \times 10^{18}$ atoms per cm$^3$, and a 0.5 $\mu$m thick layer 6 of p-type GaAs having a doping concentration of approximately $1 \times 10^{18}$ atoms per cm$^3$. On top of this, a 1 $\mu$m thick masking layer 10 is provided, for example, of photoresist in the form of a strip whose longitudinal axis is at right angles to the plane of the drawing of FIG. 2, which represents a diagrammatic cross-section perpendicular to the longitudinal direction of the resulting structure. After that, a mesa-shaped strip 12 is etched into the semiconductor layer structure of FIG. 2 (see FIG. 3), the GaAs contact layer 6 being removed by means of an etchant which contains NH$_3$, H$_2$O$_2$, and H$_2$O in the ratio 2:1:50, the etching rate of which is approximately 0.7 $\mu$m/min at room temperature. The subjacent In$_{0.50}$Ga$_{0.50}$P intermediate layer 5 acts as an etching stopper layer during this. After removal of the mask 10 and cleaning of the structure thus obtained, a conducting layer 8 is provided on the substrate 1 by means of, for example, sputtering, this layer consisting of a gold-germanium-nickel layer with a thickness of approximately 1000 Å (see FIG. 1). Finally, a conducting layer 7 is provided over the upper surface of the structure, for example by the same technique, for example consisting of a platinum, a tantalum and a gold layer whose thicknesses are approximately 1000, approximately 500, and approximately 2500 Å, respectively. After cleaving, the individual radiation-emitting semiconductor diodes—in this case diode lasers of the gain-guided type are ready for final mounting. For further particulars the reader is also referred to a simultaneously submitted Netherlands Patent Application filed by Applicant corresponding to U.S. Ser. No. 690,443, filed Apr. 23, 1991. The advantages mentioned above of a comparatively high growing temperature, in this example approximately 760° C., are illustrated by means of FIGS. 4 and 5.

Figure 4:
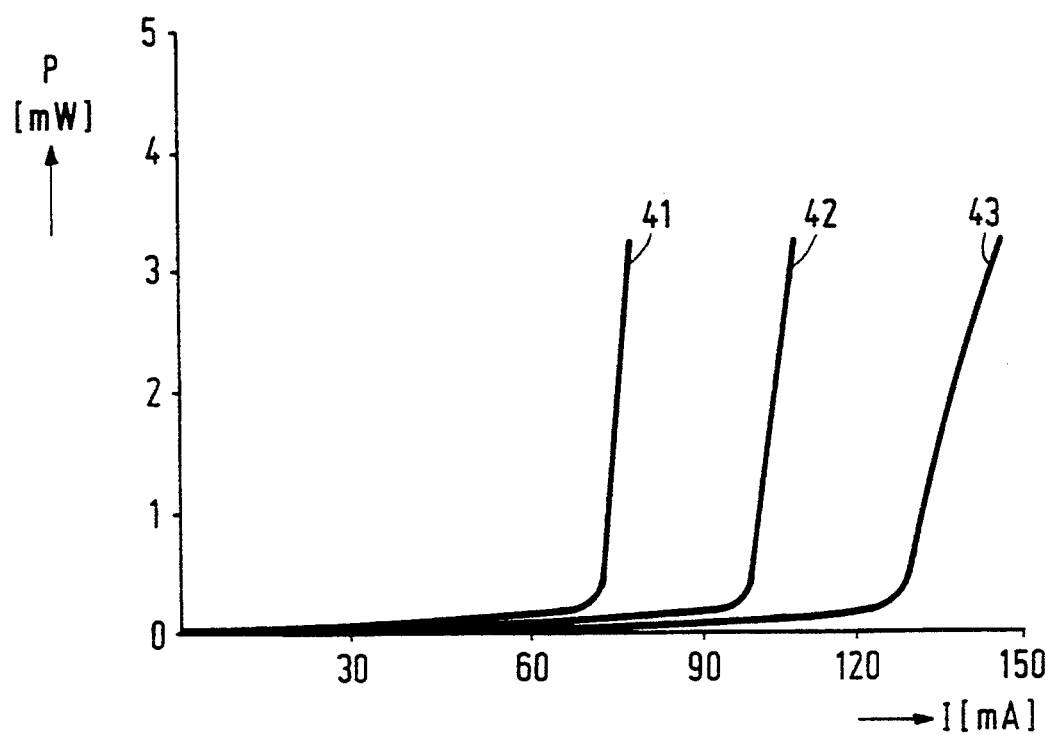
FIG. 4 shows the light output plotted against the current of a radiation-emitting semiconductor diode according to the invention which comprises 9 at % aluminium in the active layer and is manufactured at a growing temperature of 700° C.
Figure 5:
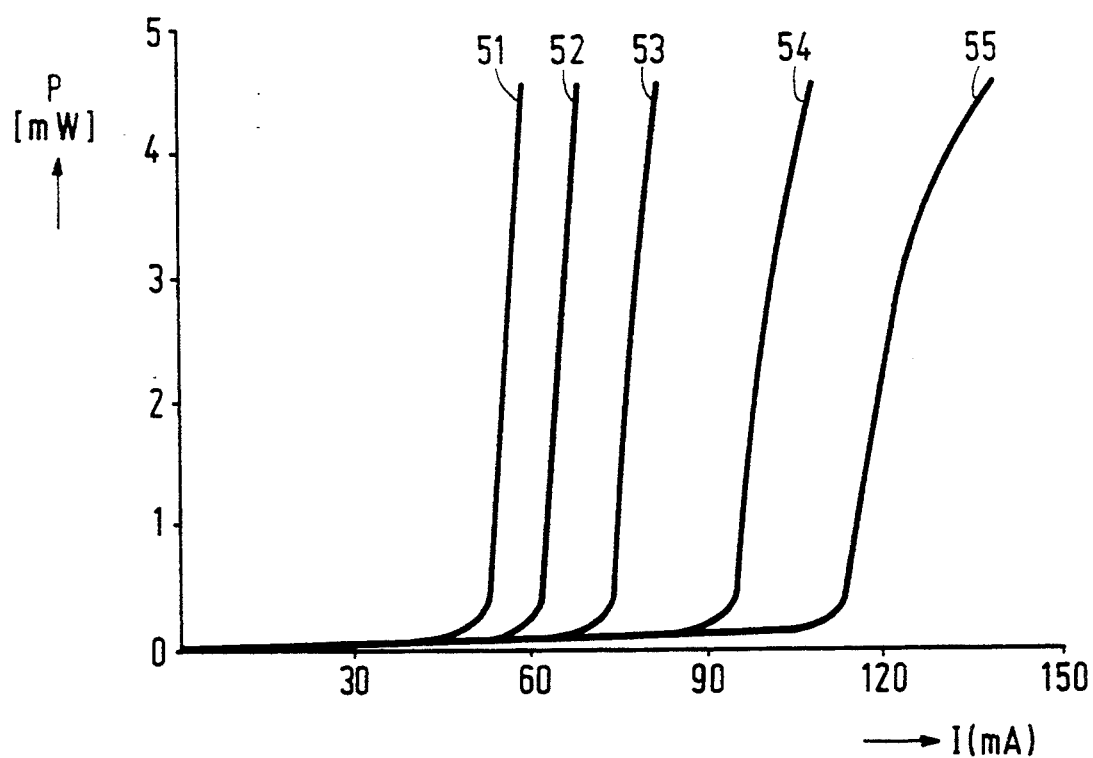
FIG. 5 shows the light output plotted against the current of a radiation-emitting semiconductor diode according to the invention which comprises 0 at % aluminium in the active layer and is manufactured at a growing temperature of 760° C.

FIG. 4 shows the light output or power (P) plotted against the current (I) through a radiation-emitting semiconductor diode comprising 9 at % aluminium in the approximately 0.1$\mu$m thick active layer 3 of InAlGaP, of which the AlGaAs buffer layer contains approximately 25 at % aluminium, the cladding layers 2 and 4 of InAlGaP containing approximately 35 at % aluminium, and which is manufactured at a growing temperature of 700° C. The curves 41, 42 and 43 represent the P-I characteristics at 20°, 40° and 50° C., respectively. FIG. 5 shows the light output (P) plotted against the current (I) for a radiation-emitting semiconductor diode according to the invention whose structure corresponds to that of the diode of FIG. 4. The only differences lie in the aluminium content of the active layer 3, which is zero at % here, and in the fact that the diode of FIG. 5 is manufactured at a growing temperature of 760° C. The curves 51, 52, 53, 54 and 55 represent the PI characteristics at 20, 40, 60, 80 and 90° C., respectively. The emission wavelength was approximately 650 nm for the diode of FIG. 4 as well as that of FIG. 5. Comparison of the characteristics of FIG. 5 with those of FIG. 4 shows that the former are much more favourable: the starting currents at 20° C. (curves 51 and 41) are approximately equally high, it is true, but the starting current increases much more strongly with increasing temperatures in FIG. 4 than in FIG. 5. Whereas a starting current of 120 mA (curve 43) is reached in FIG. 4 as early as at 50° C., in FIG. 5 this is not the case until at 90° C. (curve 55). So the radiation-emitting semiconductor diodes of FIG. 5 have a much higher maximum operating temperature than those of FIG. 4 at substantially the same wavelength as the diodes of FIG. 4, i.e. approximately 650 nm. This comparison confirms that the presence of a buffer layer comprising AlGaAs with an aluminium content of at least approximately 9 at % renders it possible to increase the growing temperature to 760° C. with favourable results: a favourable result is especially the comparatively low emission wavelength, which is approximately 650 nm here for an active layer comprising InGaP, which corresponds to a photoluminescence wavelength of approximately 640 nm ($E_g = 1.94$ eV). It is further apparent that the application of aluminium in the active layer, while the growing temperature is kept at a usual value, does not constitute an equivalent possibility for lowering the wavelength of the emission. Although a laser wavelength of 650 nm is also achieved in this way at an aluminium content of 9 at % of the active layer, the P-I characteristics of such diodes are much less favourable. The influence of the aluminium content of the buffer layer on the crystal quality of a layer grown thereon is shown in FIG. 6.

Figure 6:
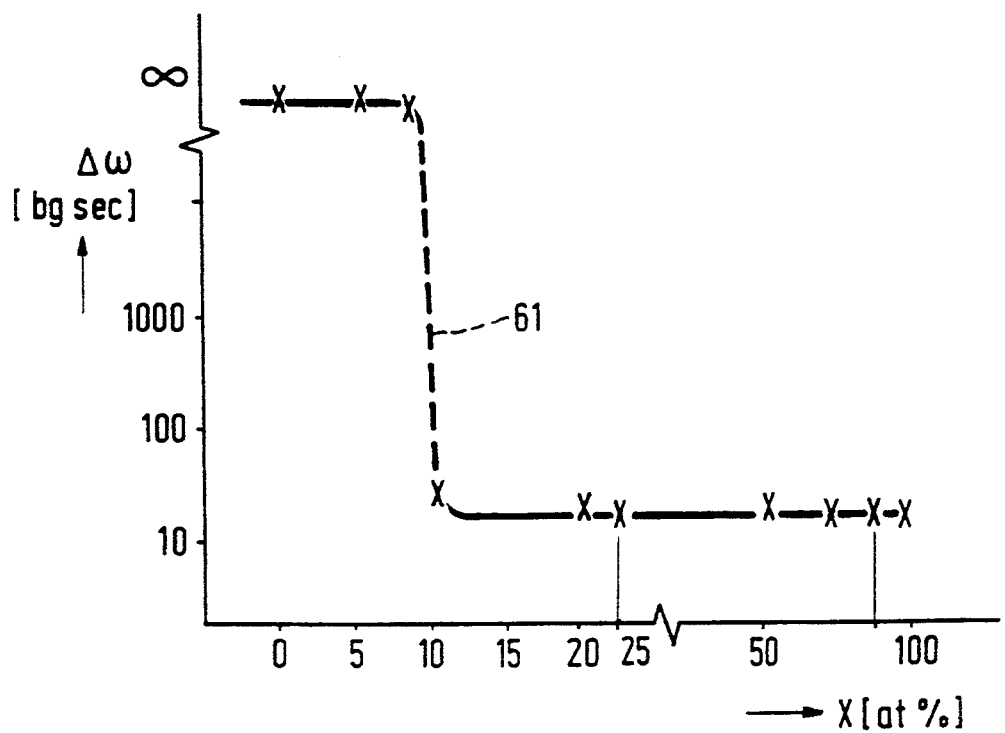
FIG. 6 shows the half-value width of the 004 reflection in a double-crystal measurement of a semiconductor layer comprising indium-aluminium-gallium phosphide grown on a buffer layer comprising aluminium-gallium arsenide as a function of the aluminium content of the buffer layer, the layers being grown at a temperature of 760° C.

FIG. 6 shows the half-value width $\Delta\omega$ of the 004 reflection in a double-crystal measurement of a semiconductor layer comprising indium-gallium phosphide and grown on a buffer layer comprising aluminium-gallium arsenide as a function of the aluminium content x of the buffer layer, the substrate used being a (001) GaAs substrate. The growing temperature was 760° C. The broken-line curve 61 gives the development of the half-value width $\Delta\phi$ in arc sec as a function of the aluminium content x in at % of the buffer layer. FIG. 6 shows that the crystal quality of such a semiconductor layer comprising InGaP is improved very greatly when the aluminium content of the buffer layer rises from approximately 8 to 9 at %. A similar result to that in FIG. 6 was found for a growing temperature of approximately 730° C.: an infinitely wide reflection was observed in the case of 0 and 5.6 at % aluminium in the buffer layer here, and a narrow reflection was observed for an aluminium content of 6.5 at % or higher. This means that for this growing temperature, which is accompanied by an InGaP band gap of approximately 1.88 eV, the minimum aluminium content of the buffer layer is approximately 6 at %. As noted earlier, a buffer layer comprising less than 100 at % aluminium is preferred for practical reasons.

The invention is not limited to the embodiments given here, since many modifications and variations are possible for those skilled in the art within the scope of the invention. Thus other compositions of the chosen semiconductor materials than those mentioned in the example may be used: radiation-emitting semiconductor diodes having an active layer comprising InAlGaP may also be used. The conductivity types may also be all replaced by their opposites (simultaneously). As far as the maximum growing temperature is concerned, it should be noted that an even more disorderly distribution was found at 790° C. than at approximately 760° C., but that problems arose concerning the morphology of the semiconductor layers at 790° C. The aluminium content of the buffer layer used during this was approximately 25 at %. Optimization of the remaining growth conditions and an accurate determination of the minimum aluminium content of the buffer layer at higher growing temperatures than 760° C. yield an indication of the maximum growing temperature at which the method according to the invention can be used.

Depending on the application, an LED version or a laser version of a radiation-emitting semiconductor diode according to the invention may be chosen. Within the laser version, both a gain-guided and an index-guided structure may be used. Finally, it should be noted that the methods for providing the semiconductor layers used in the embodiments may also be other methods than the MOVPE technique. Thus, besides MOVPE, MOMBE (Metal Organic Molecular Beam Epitaxy), MBE (Molecular Beam Epitaxy), or VPE (Vapour Phase Epitaxy) may be used.

We claim:

1. A method of manufacturing a radiation-emitting semiconductor diode comprising the steps, whereby at least a first cladding layer of indium-aluminium-gallium phosphide and of a first conductivity type, an active layer of indium-gallium phosphide, and a second cladding layer of indium-aluminium-gallium phosphide and of a second conductivity type are provided in that order on a semiconductor substrate of gallium arsenide and of the first conductivity type, a buffer layer being provided before the application of the first cladding layer, characterized in that the semiconductor material chosen for the buffer layer is aluminium-gallium arsenide with an aluminium content which is at least equal to a minimum value belonging to the band gap of the active layer, while a growing temperature is chosen higher than 700° C.

2. A method as claimed in claim 1, characterized in that a growing temperature of at least approximately 730° C. is chosen and an aluminium content for the buffer layer of at least approximately 6 atom percents is chosen.

3. A method as claimed in claim 2, characterized in that a growing temperature of at least approximately 760° C. is chosen and an aluminium content for the buffer layer of at least approximately 9 atom percents is chosen.

4. A method as claimed in claim 3, in which the technique chosen for providing the layers on the substrate is the MOVPE technique, characterized in that the substrate chosen is a (001) substrate, the growing temperature chosen is a growing temperature of approximately 760° C., and the V/III ratio chosen is one which lies between approximately 100 and 400.

5. A method as claimed in claim 1, characterized in that a growing temperature of at least approximately 760° C. is chosen and an aluminum content for the buffer layer of at least approximately 9 atom percent is chosen.

6. A method as claimed in claim 1, in which the technique chosen for providing the layers on the substrate is the MOVPE technique, characterized in that the substrate chosen is a (001) substrate, the growing temperature chosen is a growing temperature of approximately 760° C., and the V/III ratio chosen is one which lies between approximately 100 and 400.

* * * * *